(12) United States Patent
Lou

(10) Patent No.: US 6,291,333 B1
(45) Date of Patent: Sep. 18, 2001

(54) METHOD OF FABRICATING DUAL DAMASCENE STRUCTURE

(75) Inventor: Chine-Gie Lou, Hsinchu Hsien (TW)

(73) Assignee: Taiwan Semiconductor Manufacturing Co., LTD, Hsinchu (TW)

( * ) Notice: Subject to any disclaimer, the term of this patent is extended or adjusted under 35 U.S.C. 154(b) by 0 days.

(21) Appl. No.: 09/557,510

(22) Filed: Apr. 25, 2000

(30) Foreign Application Priority Data

Apr. 7, 2000 (TW) .............................................. 089106402

(51) Int. Cl.$^7$ ................................................ H01L 21/4763
(52) U.S. Cl. .......................... 438/618; 438/616; 438/622; 438/623; 438/624; 438/637; 438/638; 438/639; 438/640
(58) Field of Search ...................... 438/618, 622, 438/637, 639, 640, 623, 624, 616

(56) References Cited

U.S. PATENT DOCUMENTS 6,027,577 * 3/2001 Wang et al. .......................... 438/706
6,027,993 * 2/2000 Ueda ................................... 438/618
6,071,806 * 6/2000 Wu et al. ............................. 438/622
6,080,655 * 6/2000 Givens et al. ....................... 438/626
6,140,226 * 10/2000 Grill et al. .......................... 438/637
6,225,204 * 5/2001 Wu et al. ............................. 438/597

* cited by examiner

*Primary Examiner*—Matthew Smith
*Assistant Examiner*—V. Yevsikov
(74) *Attorney, Agent, or Firm*—Jiawei Huang; J.C. Patents

(57) ABSTRACT

A method of fabricating a dual damascene structure. The method forms a silicon oxide layer, a stop layer, a low k organic dielectric layer, and a cap layer are formed in sequence on a substrate. A trench is formed in the cap layer and the low k organic dielectric layer, while a via opening is formed in the stop layer and the silicon oxide layer. A part of the stop layer is removed to form a cavity below the low k organic dielectric layer, followed by forming fluorinated poly-arlyethers spacers on sidewalls of the trench and the via opening which fills the cavity. The trench and the via opening are then filled with a copper layer to form a dual damascene structure.

17 Claims, 4 Drawing Sheets

METHOD OF FABRICATING DUAL DAMASCENE STRUCTURE

CROSS-REFERENCE TO RELATED APPLICATION

This application claims the priority benefit of Taiwan application serial no. 89106402, filed Apr. 7, 2000.

BACKGROUND OF THE INVENTION

1. Field of Invention

The present invention relates to a fabrication method for multilevel interconnects of a semiconductor device. More particularly, the invention relates to a method of fabricating a dual damascene structure.

2. Description of Related Art

In the development of semiconductor industry, an improvement in operation speed of the device has always been a technology that all semiconductor manufacturers are up to compete, as well as been a main criterion that consumers take into account when making a purchase. With a rapid development of an integrated circuit process, a resistance of a conductive line and a parasitic capacitance between the conductive lines are determined as two key factors among all factors for influencing the operation speed of the device. Accordingly, a metal layer having a low resistance, such as a copper layer can substitute an aluminum layer used in the conventional method for reducing the resistance of the conductive line. A low dielectric constant (k) material, such as a low k organic dielectric layer can substitute a silicon oxide layer used in the conventional method for reducing the parasitic capacitance between the conductive lines.

A typical metal interconnect process involves forming a metal plug in a dielectric layer, followed by forming an aluminum line over a substrate for connecting to the metal plug. Generally, a dual damascene technique is a metal interconnect process with a high reliability and low cost, while a material selection for the metal interconnect is not limited by etching process for the metal. Therefore, this technique is widely applied to the manufacture of the copper line to reduce the resistance of the conductive line, and to further improve the operation speed and quality of the IC device. As there is a demand for a high operation speed of the device, fabricating the dual damascene with the low k material layer has been practiced in the metal interconnect process of the semiconductor industry.

FIG. 1 is a schematic, cross-sectional diagram illustrating a conventional dual damascene structure. Referring to FIG. 1, a via opening 112 is formed in a dielectric layer 104, while a trench 110 is formed in a dielectric layer 108. The via opening 112 and the trench 110 are then filled with a metal layer 114 to form a dual damascene structure.

As a conventional means to control a depth of the trench 110, a silicon nitride layer 106 is formed between the dielectric layers 104 and 108 to serve as a stop layer during an etching process for forming the trench 110.

However, the silicon nitride layer 106 has a dielectric constant of about 7, so a large parasitic capacitance easily occurs at areas, such as corners 118 of the trench 110 and the via opening 112, where the silicon nitride layer 106 makes a direct contact with the metal layer 114. This leads to a resistance-capacitance (RC) time delay and affects an operation efficiency of the device.

Moreover, as an integration of the device increases, the parasitic capacitance between two metal layers becomes more serious. Therefore, in a deep sub-micron process and below, a low k material is commonly used to form an inter-metal dielectric (IMD) layer in order to reduce the RC time delay derived from the parasitic capacitance.

The photoresist layer is commonly made of a polymer, while the common low k material is the organic polymer. So, when a photoresist layer that patterns the trench 110 is removed, an oxygen plasma can damage the low k organic dielectric layers, 108 and 104. As a result, the low k organic dielectric layers, 108 and 104 on sidewalls of the trench 110 and the via opening 112 begin to absorb water, resulting a poisoned issue when the metal layer 114 is deposited.

SUMMARY OF THE INVENTION

The invention provides a method of fabricating dual damascene structure for preventing a poisoned via or a poisoned trench.

The invention further provides a method of fabricating dual damascene structure for reducing a parasitic capacitance, while improving the operation efficiency of the device.

As embodied and broadly described herein, the invention provides a fabrication method for a dual damascene structure, which method forms a silicon oxide layer, a stop layer, a low k organic dielectric layer, and a cap layer are formed in sequence on a substrate. A trench is formed in the cap layer and the low k organic dielectric layer, while a via opening is formed in the stop layer and the silicon oxide layer. A part of the stop layer is removed to form a cavity below the low k organic dielectric layer, followed by forming spacers on sidewalls of the trench and the via opening for filling the cavity. The trench and the via opening are then filled with a copper layer to form a dual damascene structure.

According to the present invention, a part of the stop layer below the low k organic dielectric layer is removed, so that a cavity is formed between the low k organic dielectric layer and the silicon oxide layer. The spacer is made of a fluorinated polyarylethers (Flare) layer, while the Flare layer is formed by spin on coating method. Since the Flare layer is formed by spin on coating, it has an excellent gap fill capability for completely filling the cavity.

The cavity between the low k organic dielectric layer and the silicon oxide layer is filled with the spacer which is made of a Flare layer, so that the spacer can isolate the stop layer from the metal layer to avoid a direct contact therebetween. Since the Flare layer has a dielectric constant far smaller than that of the silicon nitride stop layer, the spacer can isolate the metal layer from the stop layer to reduce the RC time delay.

According to the present invention, the trench is formed in the low k organic dielectric layer, followed by filling the trench with the metal layer to form the metal line. Since the low k organic dielectric layer has a low dielectric constant, the RC time delay effect is reduced, while the efficiency of the device is improved.

Also, the low k organic dielectric layer is covered by the boron nitride cap layer and the spacer. In the step of removing the photoresist layer which forms the trench pattern, the boron nitride cap layer prevents the low k organic dielectric layer from absorbing water. Furthermore, the spacer is excellent anti-absorptive for water. Therefore, this prevents the low k organic dielectric layer which is located on the sidewall of the trench from releasing the absorbed water, when the trench is filled with the metal layer. This solves a poisoned issue caused by absorbing water moistures.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

FIGS. 2A through 2F are schematic, cross-sectional diagrams illustrating a fabrication method for a dual damascene structure according to one preferred embodiment of this invention.

Figure 1:
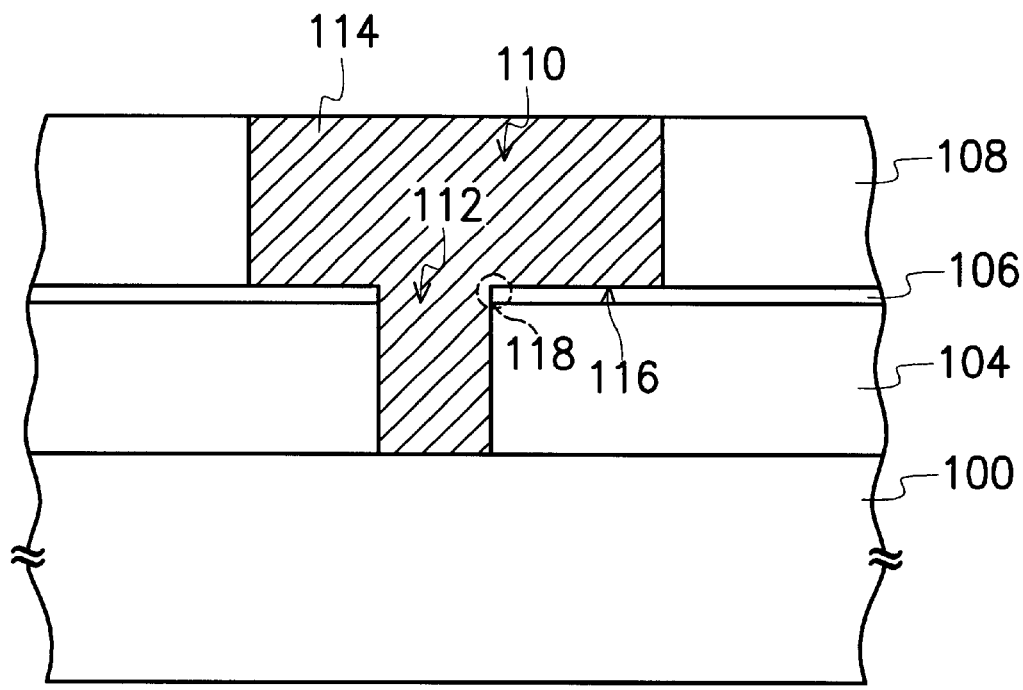
FIG. 1 is a schematic, cross-sectional diagram illustrating a conventional dual damascene structure.
Figure 2A:
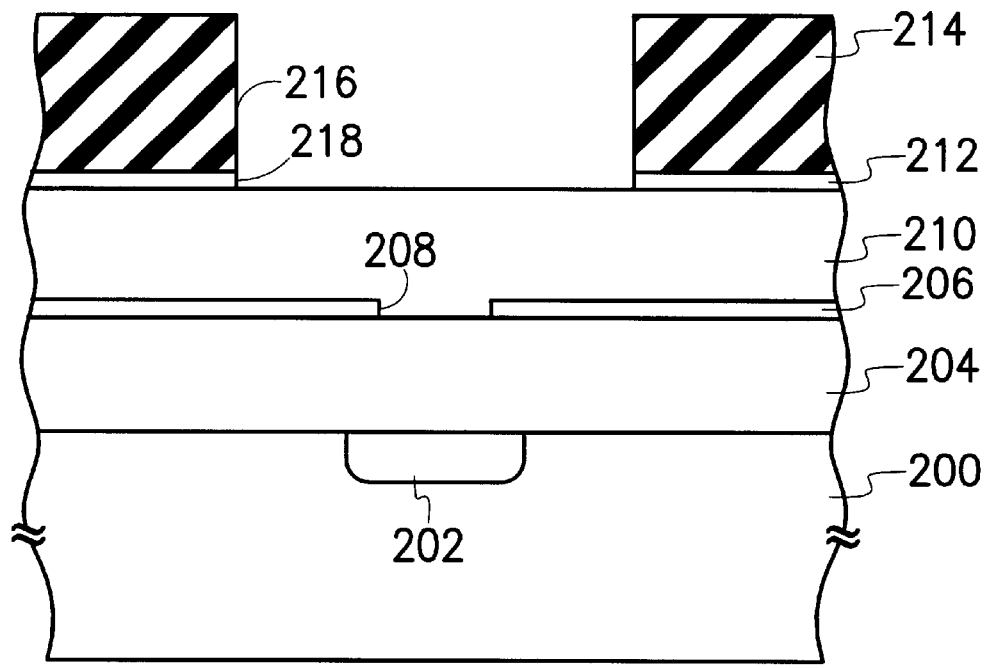
FIGS. 2A through 2F are schematic, cross-sectional diagrams illustrating a fabrication method for a dual damascene structure according to one preferred embodiment of this invention.

Referring to FIG. 2A, a dielectric layer 204 and a stop layer 206 are formed in sequence on a substrate 200 having a device region 202 therein. The dielectric layer 204 includes silicon oxide, and the dielectric layer 204 is formed by chemical vapor deposition (CVD) to a thickness of about 2000–3500 angstroms. An opening 208 is formed in the stop layer 206 and is located above the device region 202. The stop layer 206 has a different etching rate from those of the dielectric layer 204 and a dielectric layer 210 formed subsequently. The stop layer 206 includes silicon nitride, and the stop layer 206 is formed by chemical vapor deposition to a thickness of about 300–2000 angstroms.

Another dielectric layer 210 is formed over the substrate 200, the dielectric layer 210 is made of a material having a low dielectric constant (k), with the dielectric constant no larger than 3. The dielectric layer 210 preferably includes organic material made of spin on polymer (SOP) having a thickness of about 2500–5000 angstroms.

A cap layer 212 is then formed on the dielectric layer 210, wherein the cap layer 212 has an opening 218 therein for patterning a trench. The method for forming the opening 218 includes forming a photoresist layer 214 having a trench pattern 216 over the substrate 200. The cap layer 212 is preferably made of boron nitride, and the cap layer 212 is formed by CVD to a thickness of about 500–3500 angstroms.

Figure 2B:
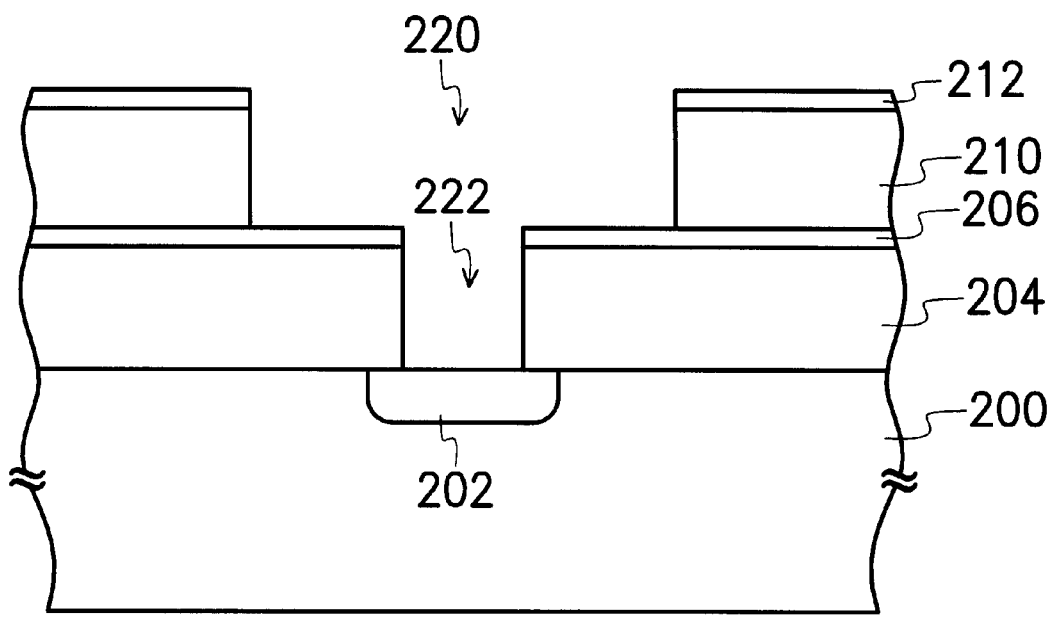

Referring to FIG. 2B, the photoresist layer 214 is removed by using an oxygen plasma. A part of the dielectric layer 210 is then removed by anisotropic etching, such as reactive ion etching (RIE), with the cap layer 212 serving as a mask, so as to form a trench 220 in the dielectric layer 210. While a part of the stop layer 206 is exposed by the trench 220, the etching process is continued with the stop layer 206 serving as a mask, so as to form a via opening 222 in the dielectric layer 204 for exposing the device region 202.

In the process of removing the photoresist layer 214 using the oxygen plasma, a part of the dielectric layer 210 exposed by the opening 218 is damaged by the oxygen plasma, while the damaged part is removed by etching in the process of forming the trench 220. Since there are no other steps of removing the photoresist layer either after the photoresist layer 214 is removed or before the metal layer is deposited, neither the dielectric layer 210 exposed by the trench 220 nor the dielectric layer 204 exposed by the via opening 222 is damaged by the oxygen plasma.

Figure 2C:
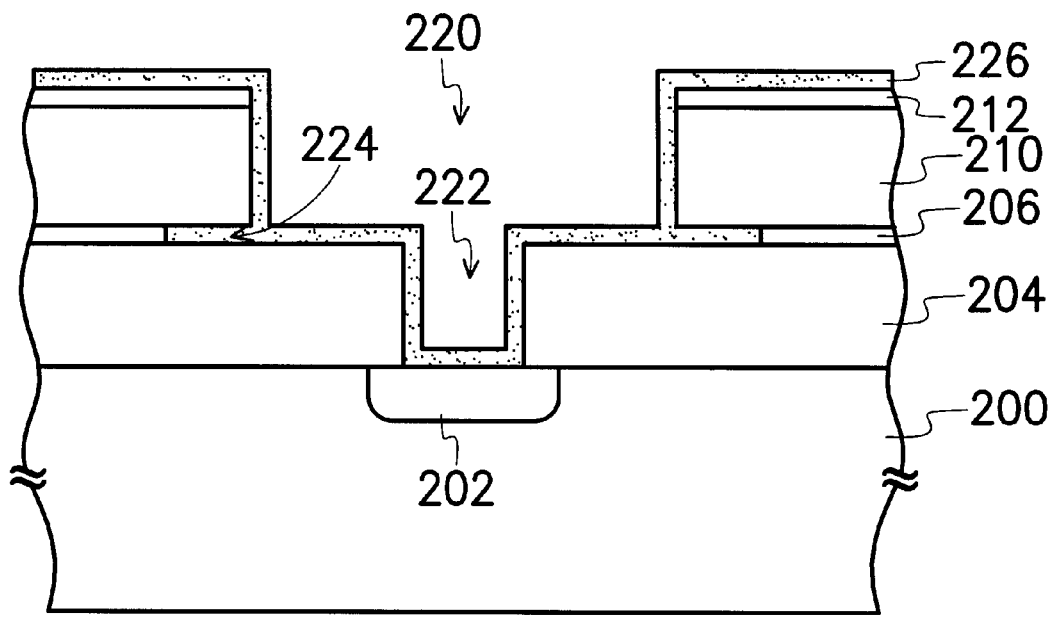

Referring to FIG. 2C, a part of the stop layer 206 is removed so as to form a cavity 224 between the dielectric layer 210 and the dielectric layer 204. The method for removing the stop layer 206 includes chemical dry etching (CDE).

A material layer 226 is formed over the substrate 200, wherein the material layer 226 covers a profile of the trench 220 and a profile of the via opening 222 and fills the cavity 224. The material layer 226 preferably includes a fluorinated polyarylethers (Flare) layer formed by spin on coating. Since the Flare layer is formed by spin on coating, it has an excellent gap fill capability for completely filling the cavity 224, without exposing the stop layer 206.

Figure 2D:
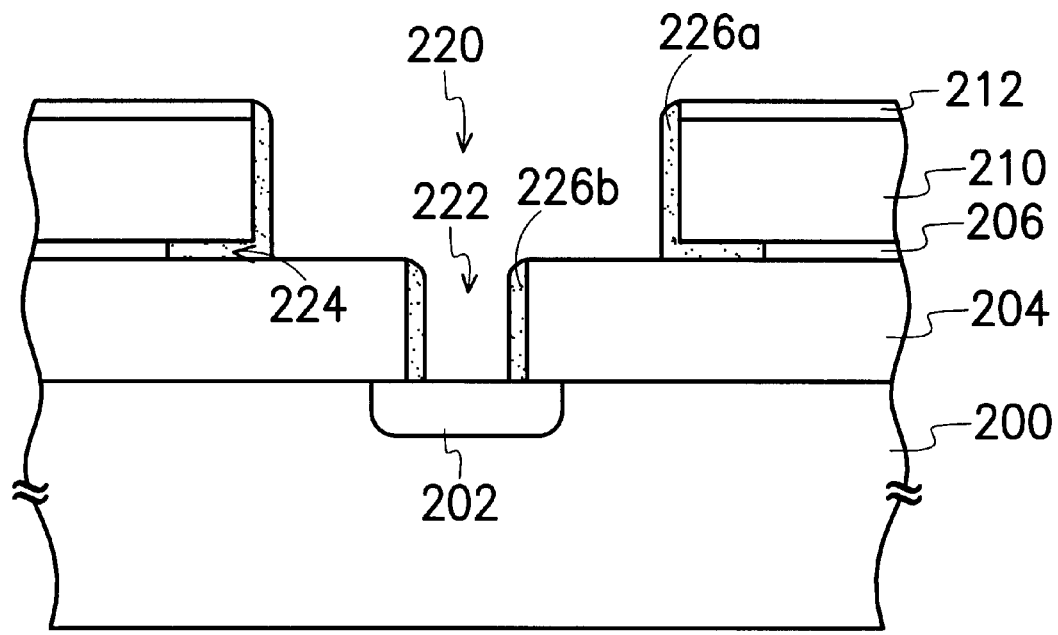

Referring to FIG. 2D, an anisotropic etching process, such as reactive ion etching process, is performed to remove a part of the material layer 226, while remaining parts of the material layer 226 form spacers 226a, 226b. The spacer 226a is formed to cover sidewalls of the cap layer 212 and the dielectric layer 210, as well as to fill the cavity 224 between the dielectric layer 210 and the dielectric layer 204. The spacer 226b is formed to cover sidewalls of the dielectric layer 204.

Figure 2E:
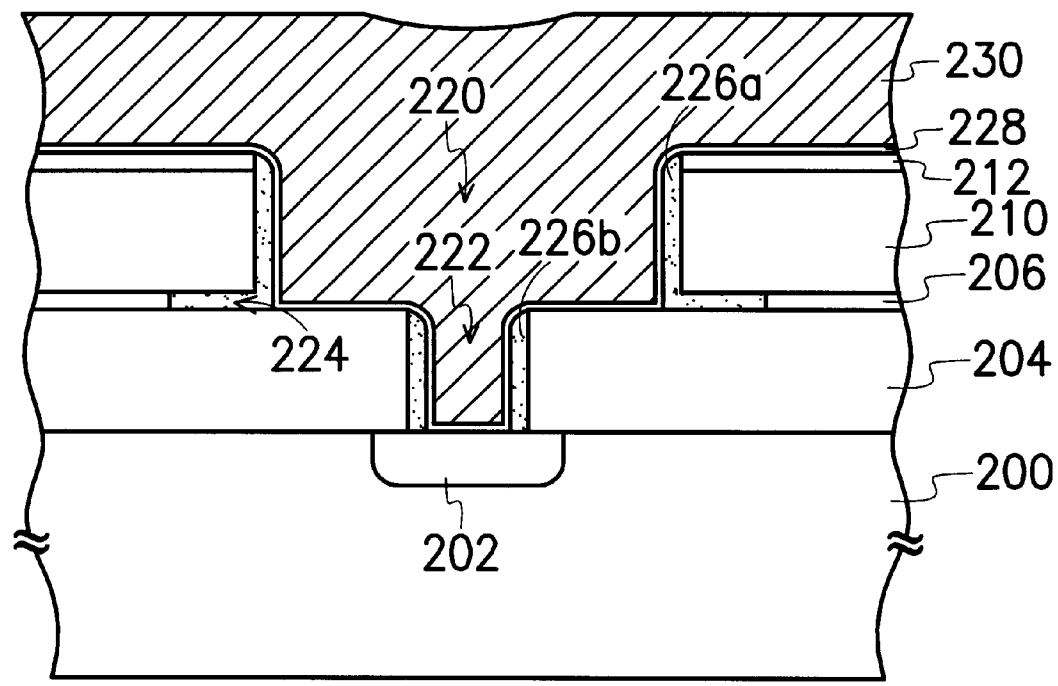

Referring to FIG. 2E, a barrier layer 228 is formed over the substrate 200 to cover the cap layer 212, the spacer 226a, the dielectric layer 204, the spacer 226b, and the device region 202. A metal layer 230 is then formed on the barrier layer 228 to fill the trench 220 and the via opening 222. The barrier layer 228 is made of material such as tantalum or tantalum nitride, and the method for forming the barrier layer 228 includes CVD. The metal layer 230 is made of copper, and the method for forming the metal layer 230 includes CVD or sputtering.

Figure 2F:
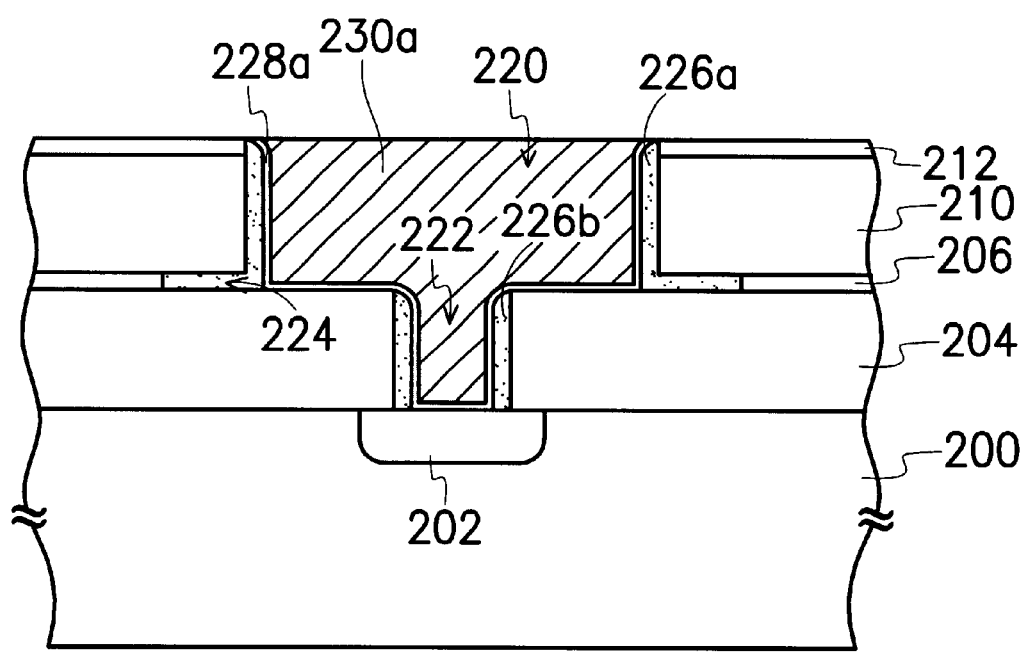

Referring to FIG. 2F, parts of the barrier layer 228 and the metal layer 230 on the cap layer 212 are removed by chemical mechanical polishing, leaving remaining parts of the barrier layer 228a and the metal layer 230a in the trench 220 and the via opening 222. As a result, the dual damascene structure is formed.

The cavity 224 between the low k organic dielectric layer 210 and the silicon oxide layer 204 is filled with the spacer 226a which is made of a Flare layer, so that the spacer 226a can isolate the stop layer 206 from the metal layer 230a to avoid a direct contact therebetween. Since the Flare layer has a dielectric constant far smaller than that of the silicon nitride stop layer 206, the spacer 226a can isolate the metal layer 230a from the stop layer 206 to reduce a RC time delay.

According to the present invention, the trench is formed in the low k organic dielectric layer, followed by filling the trench with the metal layer to form the metal line. Since the low k organic dielectric layer has a low dielectric constant, the RC time delay effect is reduced, while the efficiency of the device is improved.

Also, the low k organic dielectric layer is covered by the boron nitride cap layer and the spacer. In the step of removing the photoresist layer for forming the trench pattern, the boron nitride cap layer prevents the low k organic dielectric layer from absorbing water. Furthermore, the spacer is excellent anti-absorptive for water. Therefore, this prevents the low k organic dielectric layer which is located on the sidewall of the trench from releasing the absorbed water, when the trench is filled with the metal layer. This solves a poisoned issue caused by absorbing the moisture.

Summarizing from above, the invention has at least several advantages as follows. The method taught by the above embodiment prevents the poisoned via or the poisoned trench. Also, a parasitic capacitance is reduced, while the operation efficiency of the device is improved based on the method described in the above embodiment.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A fabrication method for a dual damascene, comprising:
   forming a first dielectric layer, a stop layer, a second dielectric layer, and a cap layer in sequence on a substrate, wherein the cap layer and the second dielectric layer having a trench therein for exposing a part of the stop layer, and the stop layer and the first dielectric layer having a via opening therein for exposing a part of the substrate;
   removing a part of the stop layer for forming a cavity between the first dielectric layer and the second dielectric layer;
   forming a first spacer on a sidewall of the cap layer and the second dielectric layer for filling the cavity and a second spacer on a sidewall of the first dielectric layer; and
   forming a metal layer for covering a profile of the trench and a profile of the via opening.

2. The fabrication method of claim 1, wherein the stop layer has a different etching rate from those of the first dielectric layer and the second dielectric layer.

3. The fabrication method of claim 2, wherein the stop layer includes silicon nitride, the first dielectric layer includes silicon oxide, and the second dielectric layer includes low k organic material.

4. The fabrication method of claim 1, wherein the cap layer includes boron nitride.

5. The fabrication method of claim 1, wherein the step of removing a part of the stop layer includes chemical dry etching.

6. The fabrication method of claim 1, wherein the first spacer and the second spacer include fluorinated poly-arlyethers.

7. The fabrication method of claim 6, wherein the method for forming the spacers comprising:
   forming a fluorinated poly-arlyethers layer for covering the cap layer, the profile of the trench, the profile of the via opening, and the substrate and filling the cavity;
   performing an anisotropic etching process for removing a part of the fluorinated poly-arlyethers layer on the cap layer, the first dielectric layer, and the substrate, so as to form the spacers.

8. The fabrication method of claim 7, wherein the anisotropic etching process includes reactive ion etching.

9. The fabrication method of claim 1, further includes forming a barrier layer before the step of forming a metal layer for covering a profile of the trench and a profile of the via opening.

10. The fabrication method of claim 1, wherein the step of forming a metal layer for covering a profile of the trench and the via opening comprising:
    forming a metal material on the substrate for covering the cap layer and filling the trench and the via opening; and
    performing a chemical mechanical polishing process for removing a portion of the metal material that covers the cap layer.

11. The fabrication method of claim 1, wherein the metal layer includes copper.

12. A fabrication method for a dual damascene, comprising:
    forming a silicon oxide layer and a stop layer in sequence on a substrate, wherein the stop layer having a first opening formed therein for exposing a part of the silicon oxide layer;
    forming a low k organic dielectric layer and a boron nitride cap layer over the substrate;
    forming a photoresist layer on the boron nitride cap layer;
    removing the boron nitride cap layer, with the photoresist layer serving as a mask, so as to form a second opening for exposing a part of the low k organic dielectric layer;
    removing the photoresist layer;
    removing the exposed part of the low k organic dielectric layer for forming a trench, with the boron nitride cap layer serving as a mask, and removing the exposed part of the silicon oxide layer for forming a via opening;
    removing a part of the stop layer for forming a cavity below the low k organic dielectric layer;
    forming a fluorinated poly-arlyethers layer for covering the boron nitride cap layer, the low k organic dielectric layer, the silicon oxide layer, and substrate, so that the cavity is filled;
    performing an anisotropic etching process for removing a part of the fluorinated poly-arlyethers layer, so as to form a first spacer and a second spacer, the first spacer covering a sidewall of the boron nitride cap layer, the low k organic dielectric layer and filling the cavity, the second spacer covering a sidewall of the silicon oxide layer;
    forming a metal layer over the substrate for covering the cap layer and filling the trench and the via opening; and
    removing a part of the metal layer that covers the cap layer by using a chemical mechanical polishing process.

13. The fabrication method of claim 12, wherein the stop layer includes silicon nitride.

14. The fabrication method of claim 12, wherein the photoresist layer is removed by using an oxygen plasma.

15. The fabrication method of claim 12, wherein the step of forming a cavity below the low k organic dielectric layer includes chemical dry etching.

16. The fabrication method of claim 12, further includes forming a barrier layer over the substrate before the step of forming a metal layer over the substrate.

17. The fabrication method of claim 12, wherein the metal layer includes copper.

* * * * *